United States Patent
Bobok et al.

(10) Patent No.: US 7,711,537 B2
(45) Date of Patent: May 4, 2010

(54) SIGNALS FOR SIMULATION RESULT VIEWING

(75) Inventors: Gabor Bobok, Niskayuna, NY (US);
Wolfgang Roesner, Austin, TX (US);
Derek E. Williams, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 712 days.

(21) Appl. No.: 11/381,437

(22) Filed: May 3, 2006

(65) Prior Publication Data

US 2007/0260443 A1     Nov. 8, 2007

(51) Int. Cl.
*G06F 17/50* (2006.01)
(52) U.S. Cl. .......................................... 703/14
(58) Field of Classification Search .................. 703/14
See application file for complete search history.

(56) References Cited

U.S. PATENT DOCUMENTS

| | | | |
|---|---|---|---|
| 5,212,650 A | 5/1993 | Hooper et al. | |
| 5,369,753 A | 11/1994 | Biles | |
| 5,369,763 A | 11/1994 | Biles | |
| 5,604,895 A | 2/1997 | Raimi | |
| 6,052,809 A * | 4/2000 | Bowden | 714/738 |
| 6,053,947 A * | 4/2000 | Parson | 703/14 |
| 6,117,181 A | 9/2000 | Dearth et al. | |
| 6,195,627 B1 | 2/2001 | Bargh et al. | |
| 6,195,629 B1 | 2/2001 | Bargh et al. | |
| 6,202,042 B1 | 3/2001 | Bargh et al. | |
| 6,285,914 B1 | 9/2001 | Bae et al. | |
| 6,295,623 B1 * | 9/2001 | Lesmeister et al. | 714/741 |
| 6,345,242 B1 | 2/2002 | Dearth et al. | |
| 6,393,426 B1 | 5/2002 | Odom et al. | |
| 6,470,478 B1 * | 10/2002 | Bargh et al. | 716/4 |
| 6,519,612 B1 | 2/2003 | Howard et al. | |
| 6,546,532 B1 | 4/2003 | Kerzman et al. | |
| 6,581,191 B1 | 6/2003 | Schubert et al. | |
| 6,618,839 B1 | 9/2003 | Beardslee et al. | |
| 6,668,364 B2 | 12/2003 | McElvain et al. | |
| 6,687,710 B1 | 2/2004 | Dey | |
| 6,720,565 B2 | 4/2004 | Innes et al. | |
| 6,751,583 B1 | 6/2004 | Clarke et al. | |
| 6,754,763 B2 | 6/2004 | Lin | |

(Continued)

OTHER PUBLICATIONS

Simucad Inc., "Silos User's Manual", version 2001.1, 2001, retrieved from the Internet Archive Wayback Machine dated Apr. 7, 2001 from http://web.archive.org/web/20070115032319/www.cs.bilkent.edu.tr/~will/courses/CS224/SilosUsersManual.pdf.*

(Continued)

*Primary Examiner*—Paul L Rodriguez
*Assistant Examiner*—Russ Guill
(74) *Attorney, Agent, or Firm*—Dillon & Yudell LLP

(57) ABSTRACT

According to a method of data processing, a data set including at least one entry specifying a signal group by a predetermined signal group name is received by a data processing system. In response to receipt of the data set, the entry in the data set is processed to identify the signal group name. Signal group information associated with an event trace file containing simulation results is accessed to determine signal names of multiple signals that are members of the signal group. Simulation results from the event trace file that are associated with instances of the multiple signals are then included within a presentation of simulation results.

23 Claims, 13 Drawing Sheets

U.S. PATENT DOCUMENTS

| | | |
|---|---|---|
| 2002/0019969 A1 | 2/2002 | Hellestrand et al. |
| 2002/0032559 A1 | 3/2002 | Hellestrand et al. |
| 2002/0046391 A1* | 4/2002 | Ito et al. ............... 716/18 |
| 2002/0049576 A1 | 4/2002 | Meyer |
| 2002/0123874 A1 | 9/2002 | Roesner et al. |
| 2002/0128809 A1 | 9/2002 | Roesner et al. |
| 2002/0129333 A1 | 9/2002 | Chandhoke et al. |
| 2002/0152060 A1 | 10/2002 | Tseng |
| 2003/0005416 A1 | 1/2003 | Henftling et al. |
| 2003/0035375 A1 | 2/2003 | Freeman |
| 2003/0037222 A1 | 2/2003 | Emberson et al. |
| 2003/0101039 A1 | 5/2003 | Gabele et al. |
| 2003/0121011 A1 | 6/2003 | Carter et al. |
| 2003/0144828 A1 | 7/2003 | Lin |
| 2003/0188299 A1 | 10/2003 | Broughton et al. |
| 2003/0192032 A1 | 10/2003 | Andrade et al. |
| 2005/0102125 A1 | 5/2005 | Tseng |
| 2005/0125754 A1 | 6/2005 | Schubert et al. |
| 2005/0137840 A1 | 6/2005 | Peck et al. |
| 2007/0067150 A1* | 3/2007 | Musselman ............... 703/14 |

OTHER PUBLICATIONS

Samir Palnitkar, "Verilog HDL", 1996, Sunsoft Press, pp. 4-7, 18-24, 185-186, 314-315.*

IEEE Computer Society, "IEEE Standard Verilog Hardware Description Language", 2001, The Institute of Electrical and Electronic Engineers.*

IEEE, "Behavioural languages—Part 1-1: VHDL language reference manual", pp. 1-293.*

Helmut Lang et al., "Automating test program generation in STIL—Expectations and Experiences using IEEE 1450", 2003, Proceedings of the Eighth IEEE European Test Workshop, six unnumbered pages.*

* cited by examiner

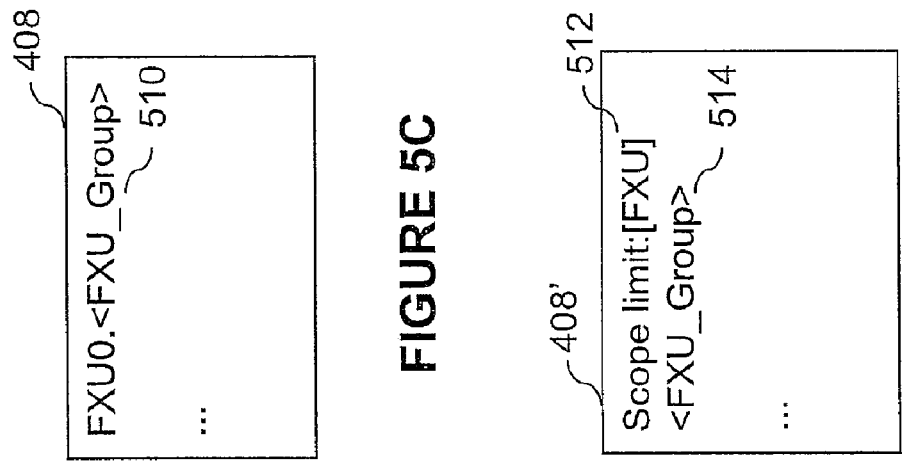
FIGURE 5C
FIGURE 5D
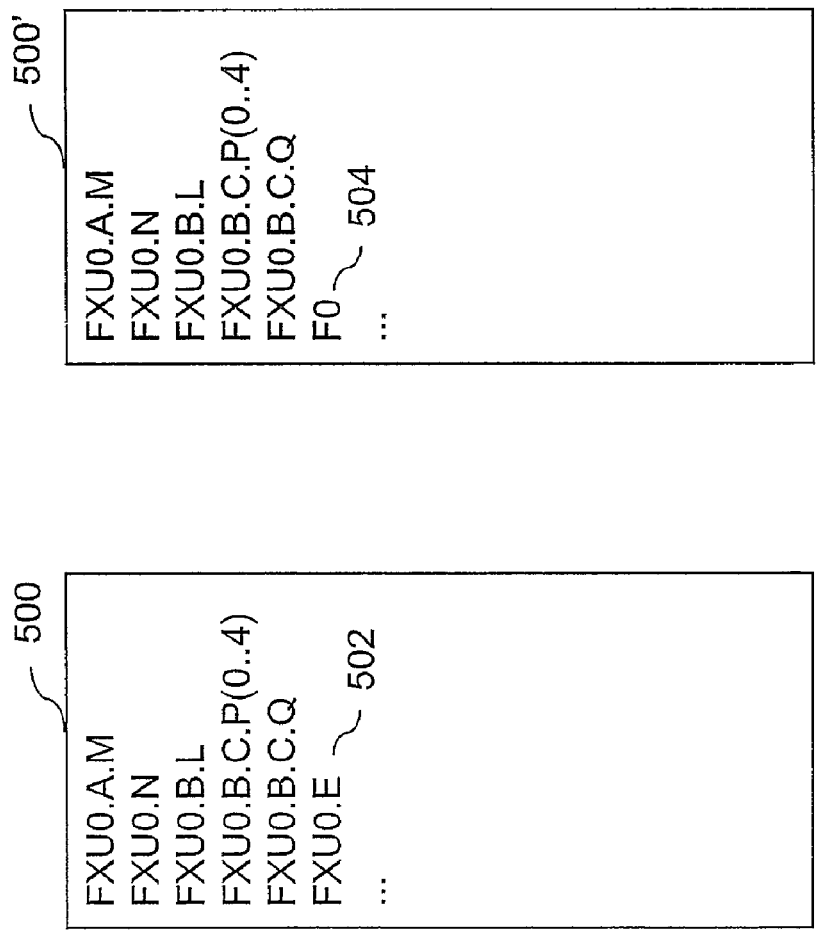
FIGURE 5B
PRIOR ART
FIGURE 5A
PRIOR ART

FIGURE 6A

```
Entity FXU IS
Port ( ...
    E: OUT STD_ULOGIC;        } 600
    G: OUT STD_ULOGIC;
    ...
);

Architecture FXU of FXU IS

BEGIN
    ... {HDL source code for design entity} ...    } 602

E <= ...;
G <= ...;

--!! Signal Group FXU_Group;          } 610
--!! N
--!! B.L
--!! B.C.P(0..4) LEFT_JUSTIFY    ~612
--!! B.C.Q
--!! E
--!! END Signal Group FXU_Group;

--!! Signal Preserve G;   ~620

...
END
```

340a

```
Entity TOP IS

Port (
    ...
  );

Architecture TOP of TOP IS

BEGIN

... {HDL for design entity} ...

--!! Signal Group FXU_Pair;
  --!! FXU0.<FXU_Group>;
  --!! FXU1.<FXU_Group>;
  --!! END Signal Group FXU_Pair;

...

END;
```

SIGNALS FOR SIMULATION RESULT VIEWING

BACKGROUND OF THE INVENTION

1. Technical Field

The present invention relates in general to simulating digital devices, modules and systems, and in particular, to computer simulation of digital devices, modules and systems.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli (i.e., testcase) representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

The result of the application of the testcase to the simulation executable model by the simulator is referred to herein as an "all events trace" (AET). The AET contains the logic values of signals and/or storage elements within the simulation executable model. An AET viewer can be utilized to present by the contents of the AET to the user for review and analysis.

As will be appreciated, for large simulation executable models, a vast amount of data will be present in the AET, not all of which will be relevant to the user. Accordingly, conventional AET viewers permit a user to input an Input/Output (I/O) list specifying signals in the simulation executable model that the user desires to view. In response, a conventional AET viewer presents to the user only those signals within the simulation executable model that are identified within the I/O list.

SUMMARY OF THE INVENTION

The present invention recognizes that user entry of the I/O list (e.g., utilizing a keyboard) is tedious and time consuming, particularly for complex simulation executable models. Accordingly, the present invention provides to a method, system and program product for simulation processing.

According to an exemplary method, a data set including at least one entry specifying a signal group by a predetermined signal group name is received by a data processing system. In response to receipt of the data set, the entry in the data set is processed to identify the signal group name. Signal group information associated with an event trace file containing simulation results is accessed to determine signal names of multiple signals that are members of the signal group. Simulation results from the event trace file that are associated with instances of said multiple signals are then included within a presentation of simulation results.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 5A depicts a first conventional I/O list in accordance with the prior art;

FIG. 5B depicts a second conventional I/O list in accordance with the prior art;

FIGS. 5C-5D illustrate exemplary I/O lists in accordance with the present invention;

FIG. 6A depicts an exemplary design entity HDL file including signal group descriptors in accordance with the present invention;

FIG. 6B illustrates an exemplary design entity HDL file including nested signal group descriptors in accordance with the present invention.

DETAILED DESCRIPTION OF A PREFERRED EMBODIMENT

Figure 1:
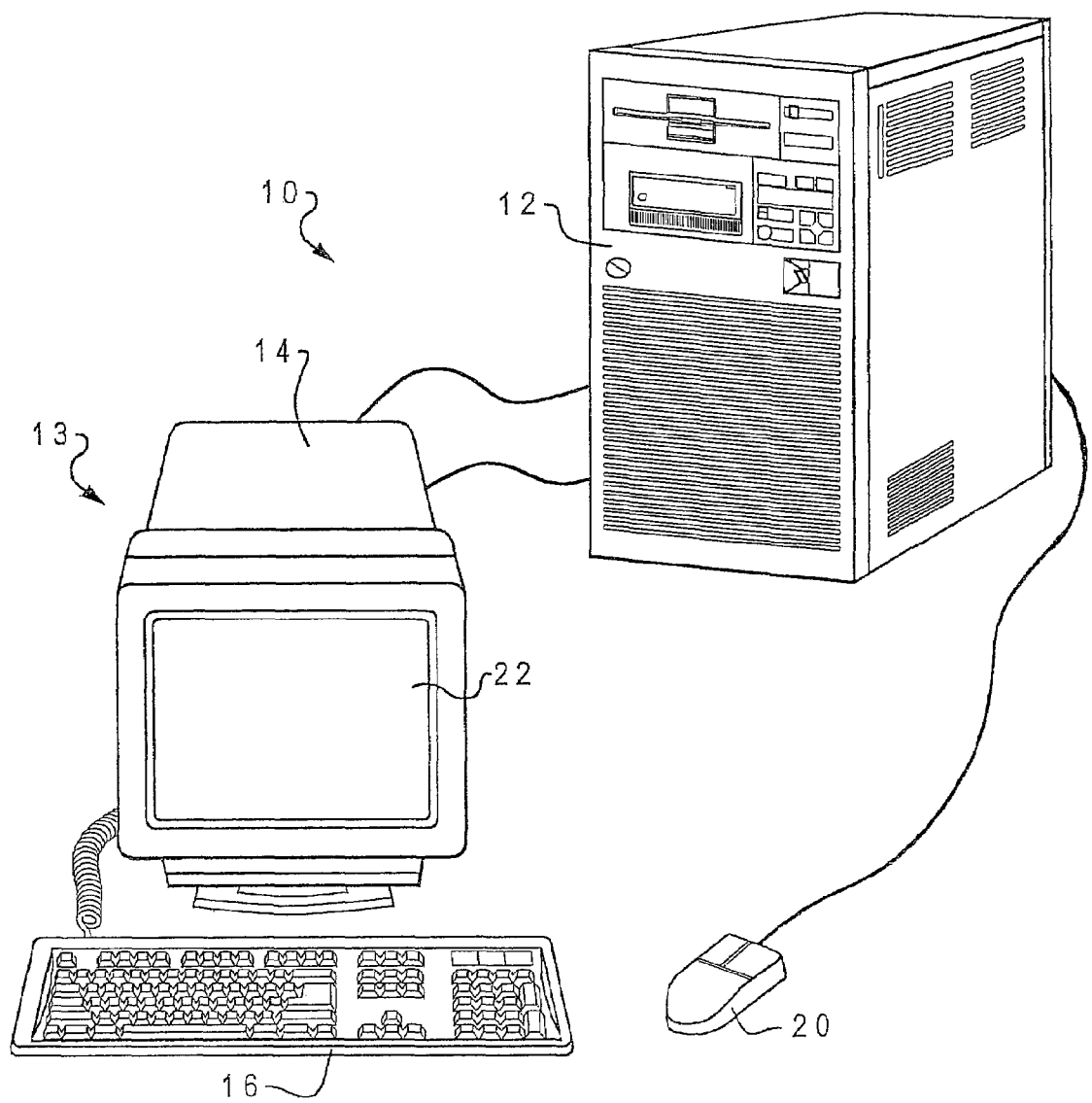
FIG. 1 is a pictorial representation of a data processing system in accordance with the present invention.

With reference now to the figures, and in particular with reference to FIG. 1, there is depicted a pictorial representation of a data processing system 10 with which the present invention may be advantageously utilized. As illustrated, data processing system 10 comprises a workstation 12 to which one or more nodes 13 are connected. Workstation 12 preferably comprises a high performance multiprocessor computer, such as one of the POWER line of computer systems available from International Business Machines (IBM) Corporation of Armonk, N.Y. Workstation 12 preferably includes nonvolatile and volatile internal storage for storing software applications comprising an ECAD system, which can be utilized to develop and verify a digital circuit design in accordance with the method and system of the present invention. As depicted, nodes 13 include a display device 14, a keyboard 16, and a mouse 20. The ECAD software applications executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow.

Figure 2:
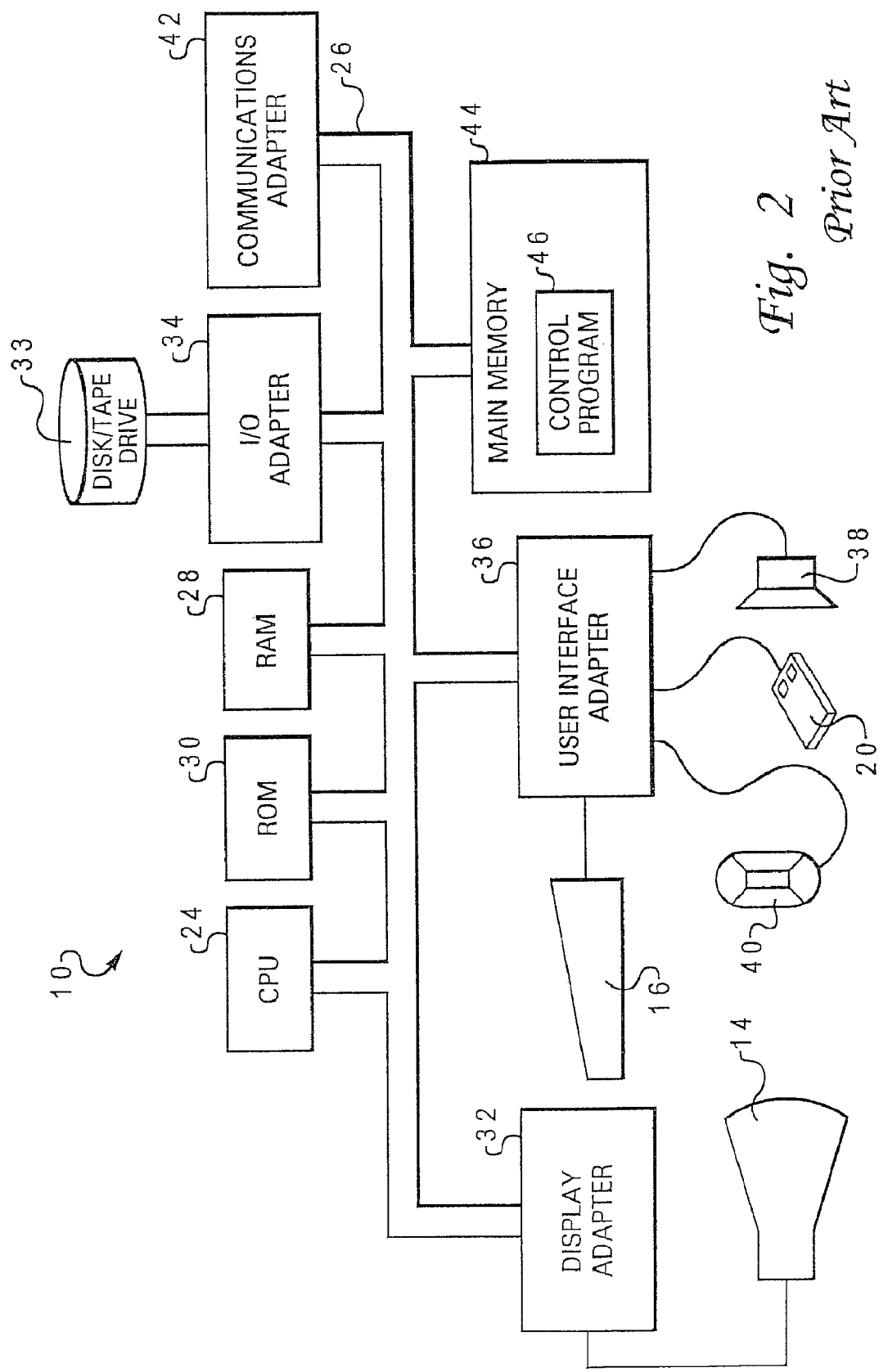
FIG. 2 depicts a representative hardware environment of the data processing system illustrated in FIG. 1.

FIG. 2 is a more detailed block diagram of data processing system 10. As illustrated, data processing system 10 includes one or more Central Processing Units (CPUs) 24, such as a conventional microprocessor, and a number of other components interconnected via system interconnect 26. Although not depicted in FIG. 2, CPUs such as CPU 24 typically include a control unit that organizes data and program storage in a computer memory and transfers the data and other information between the various parts of the computer system. CPUs also generally include one or more arithmetic logic units that execute arithmetical and logical operations, such as addition, comparison, multiplication and so forth.

Data processing system 10 further includes a random-access memory (RAM) 28, a read-only memory (ROM) 30, a display adapter 32 supporting connection of a display device 14, and an I/O adapter 34 for connecting peripheral devices (e.g., disk and tape drives 33). Data processing system 10 further includes a communications adapter 42 for connecting data processing system 10 to a communications network and a user interface adapter 36 for connecting keyboard 16, mouse 20, speaker 38, microphone 40, and/or other user interface devices to system interconnect 26.

As will be appreciated by those skilled in the art, data processing system 10 operates under the control of an operating system (e.g., AIX) and one or more other programs, which may reside in any suitable computer-readable media such as RAM 28, ROM 30, a magnetic disk, magnetic tape, or optical disk (the last three being located in disk and tape drives 33).

Figure 3A:
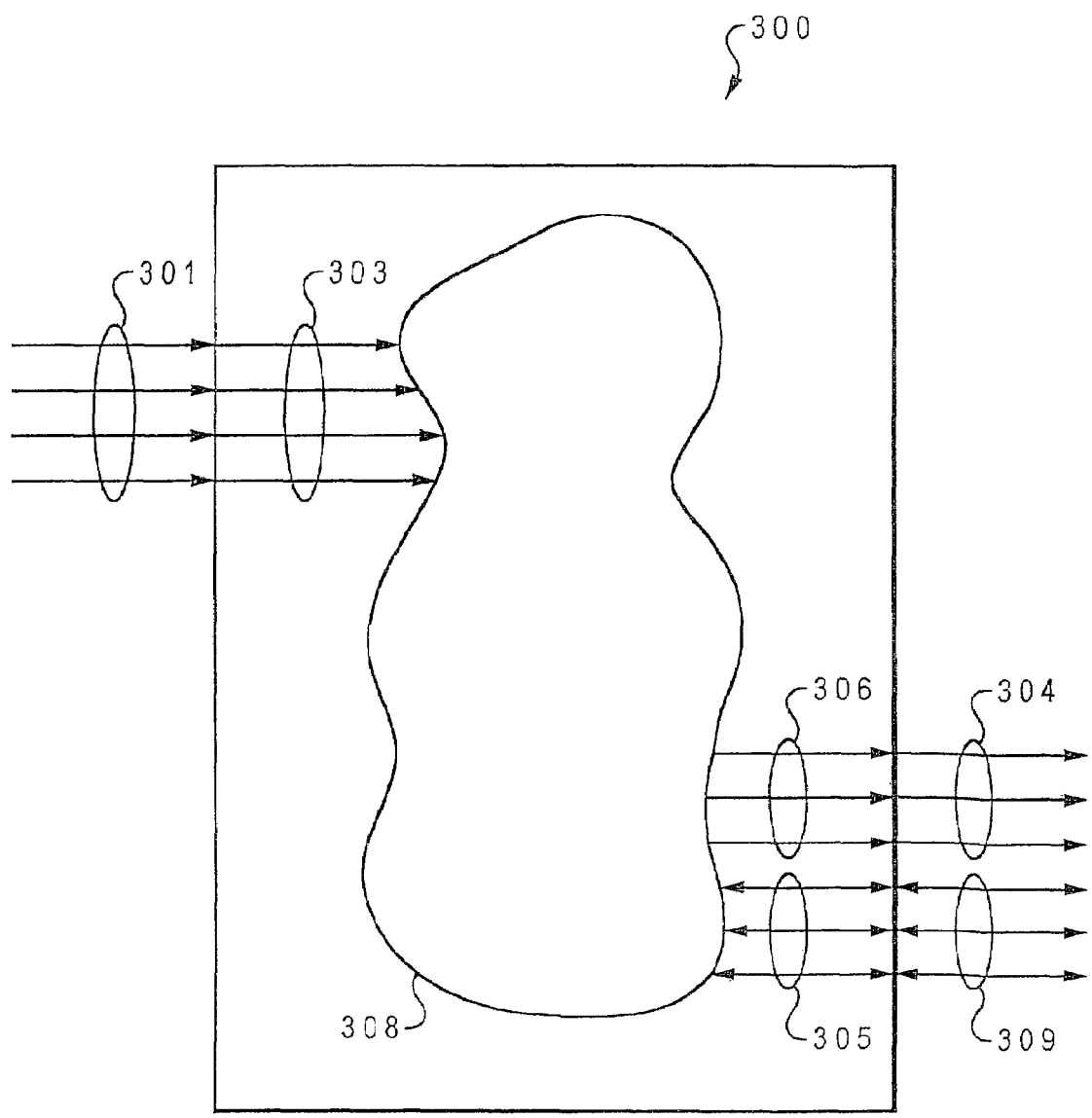
FIG. 3A is a simplified block diagram illustrating a digital design entity in accordance with the teachings of the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
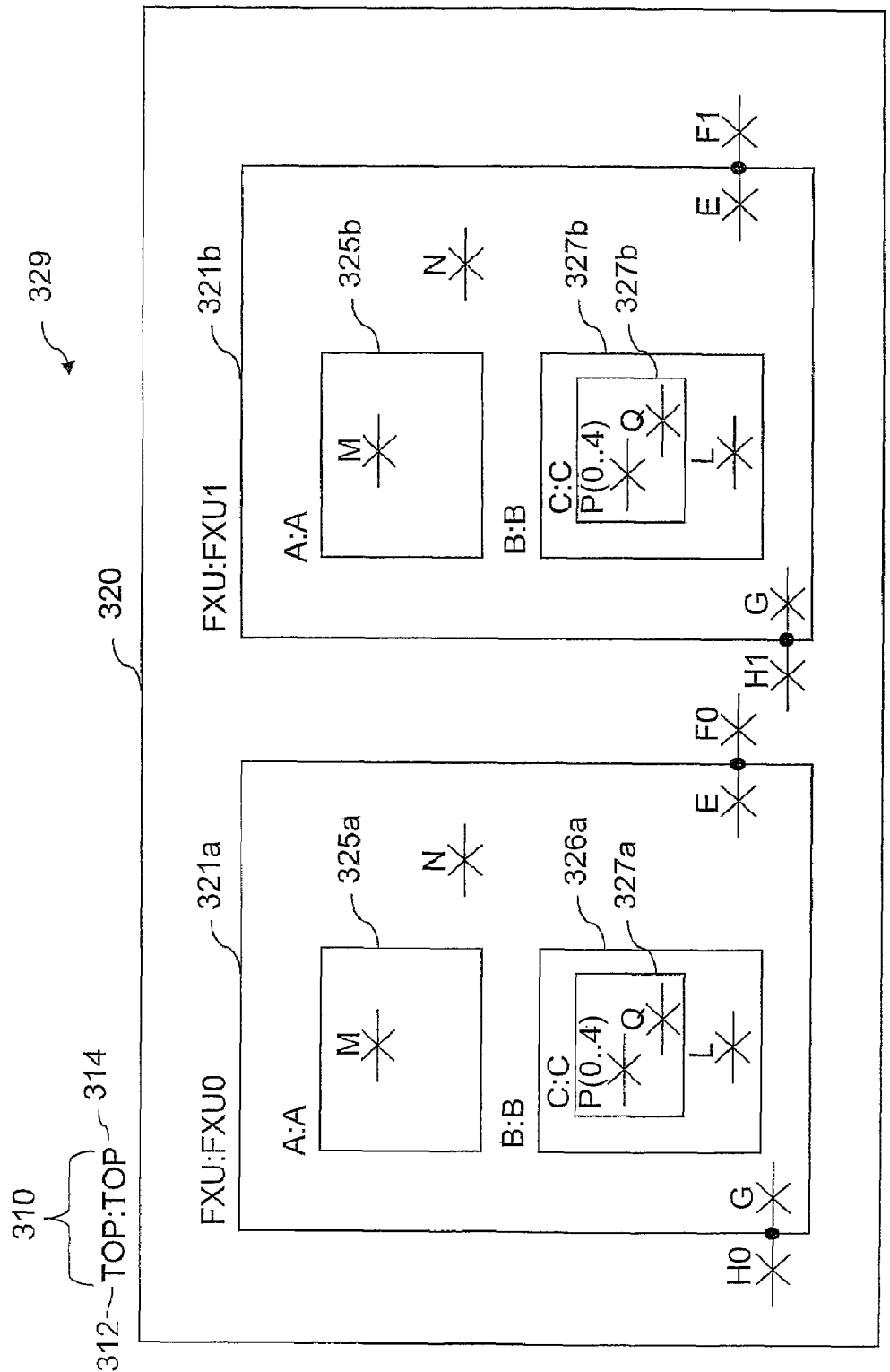
FIG. 3B is a diagrammatic representation depicting a simulation model in accordance with the teachings of the present invention.

Referring now to FIG. 3B, there is illustrated a diagrammatic representation of an exemplary simulation model 329 that may be utilized in a preferred embodiment of the present invention. Simulation model 329 includes multiple hierarchical design entities. For visual simplicity and clarity, many of the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321a and 321b, of an FXU entity 321. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1, respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b, respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Within exemplary simulation model 329, a variety of signals are instantiated (e.g., signals E, F0, F1, G, H0, H1, L, M, N, P and Q). Each signal has an associated signal name (e.g., "M") and a signal instantiation identifier, which in a preferred embodiment, is a string consisting of the enclosing entity instantiation names proceeding from the top-level entity instantiation name and terminating with the signal name. Thus, the instantiation identifier of signal M within instantiation 321a of FXU entity 321 is "TOP.FXU0.A.M". This instantiation identifier serves to uniquely identify each signal instantiation within a simulation model. It should be noted that signals, for example, signal P(0 . . . 4), can be multi-bit signal vectors. It should also be noted that some signals (e.g., signals TOP.FXU0.E, TOP.FXU1.E, TOP.FXU0.G and TOP.FXU1.G) are renamed (as signals TOP.FXU0.F0, TOP.FXU1.F1, TOP.FXU0.H0 and TOP.FXU1.H1, respectively) as they cross design entity boundaries.

Figure 3C:
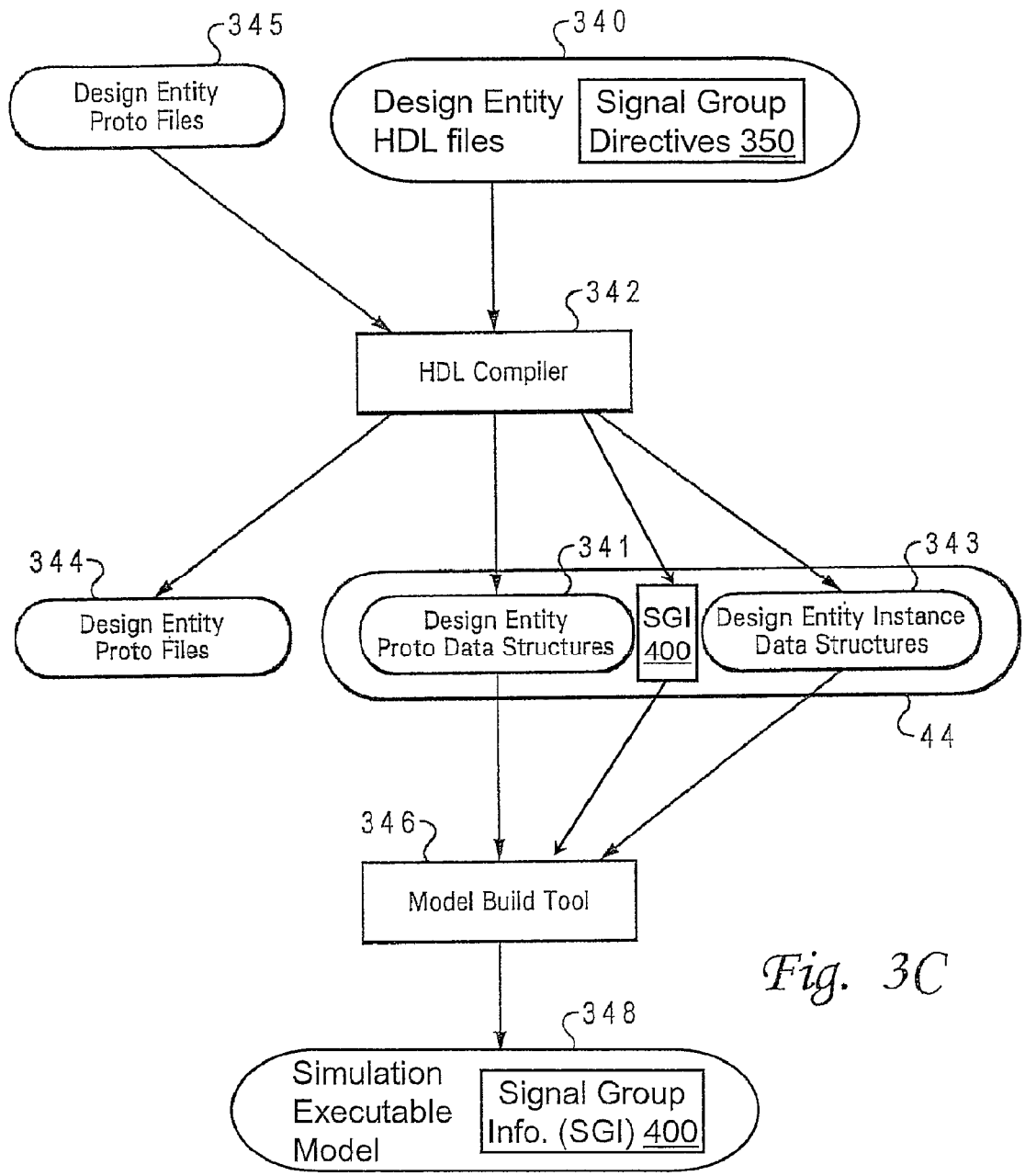
FIG. 3C is a flow diagram illustrating of a model build process in accordance with the teachings of the present invention.

Referring now to FIG. 3C, there is depicted a flow diagram of a model build process which may be implemented in a preferred embodiment of the present invention. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342 examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344 for use in subsequent compilations. Such a process will be referred to hereinafter as "incremental compilation" and can greatly speed the process of creating a simulation executable model 348. Once created by HDL compiler 342, proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU:FXU1 321b, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                                      5
{                                                          10
    if (NOT proto_loaded(file)) {                          15
        if (exists_proto_file(file) AND check_bom(file)) { 20
            load_proto(file);                              25
        } else {                                           30
            parse_HDL_file(file)                           35
            for (all instances in file) {                  40
                process_HDL_file(instance);                45
            }                                              50
            create_proto(file);                            55
            write_proto_file(file);                        60
        }                                                  65
    }                                                      70
    create_instance(file):                                 75
}                                                          80
```

When compiler 342 is initially invoked, no proto data structures 341 or instance data structures 343 are present in memory 44 of computer system 10. The main control loop, routine process_HDL_file( ) (line 5), is invoked and passed the name of the top level entity by means of parameter "file". The algorithm first determines if a proto data structure for the current entity is present in memory 44 by means of routine proto_loaded( ) (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( ) (line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35 where routine parse_HDL_file( ) loads the HDL source code file for the current entity. Routine parse_HDL_file( ) (line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60 where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( ) (line 5) recursively processes the entire simulation model creating an in-memory image of the model consisting of proto data structures 341 and instance data structures 343.

As further shown in FIG. 3C, the present invention further permits the designer to include within design entity HDL files 340 one or more signal group directives 350 identifying particular signals that are likely to be of interest when viewing the results of simulating simulation executable model 348. Exemplary semantics for signal group directives 350 is described below with reference to FIGS. 6A-6B. HDL compiler 342, in addition to the processing described above, preferably processes signal group directives 350 to generate signal group information (SGI) 400, which represents the signal instantiation identifiers of the signals of interest utilizing any convenient data structure (e.g., linked list, table, etc.). Model build tool 346 then places the signal group information (SGI) 400, optionally with some additional transformation in format, within simulation executable model 348.

Figure 3D:
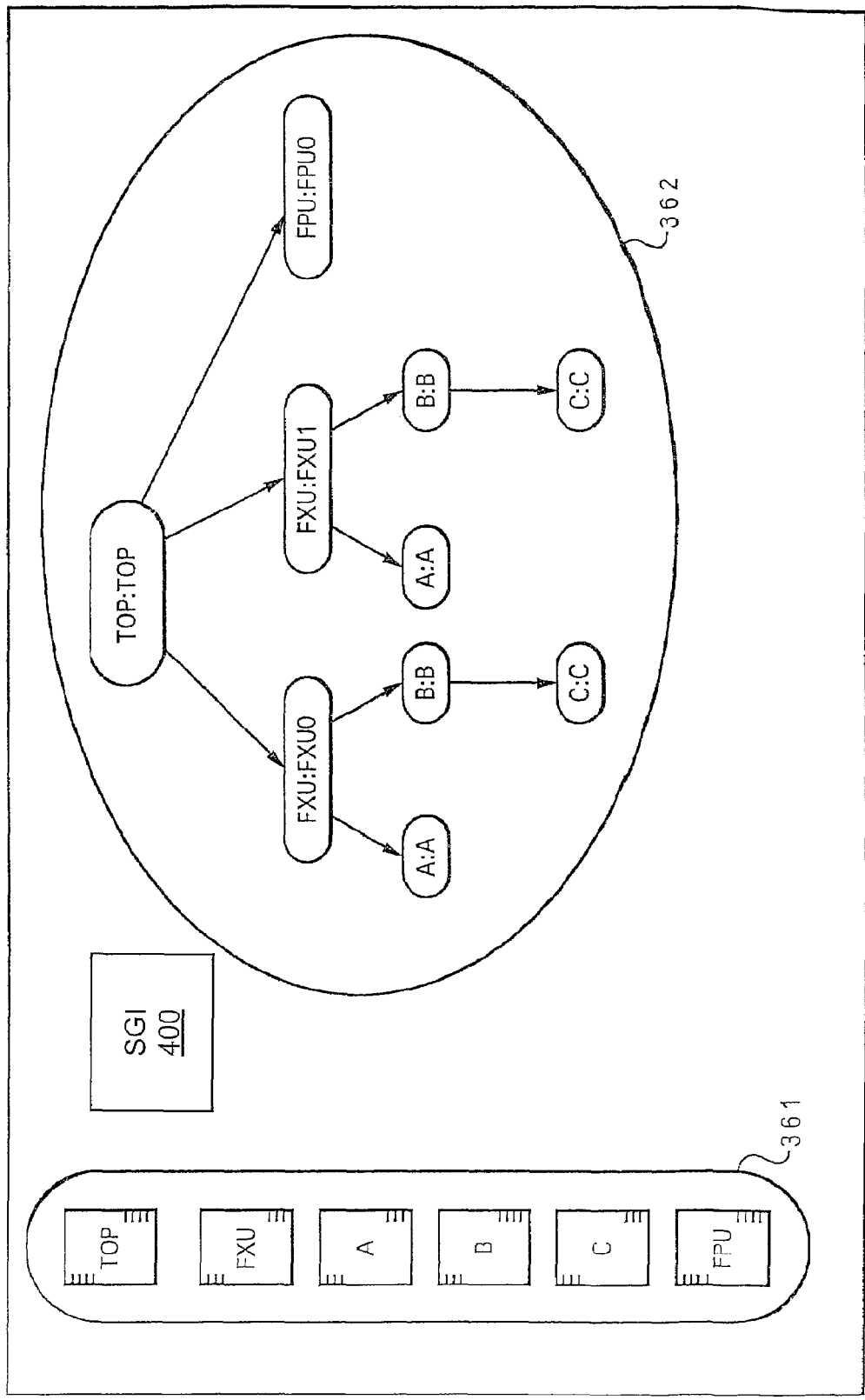
FIG. 3D is a block diagram depicting simulation model data structures representing a design in accordance with the teachings of the present invention.

With reference now to FIG. 3D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Finally, memory 44 contains SGI 400. Model build tool 346 in FIG. 3C processes the contents of memory 44 into memory data structures in order to produce simulation executable model 348.

Figure 4:
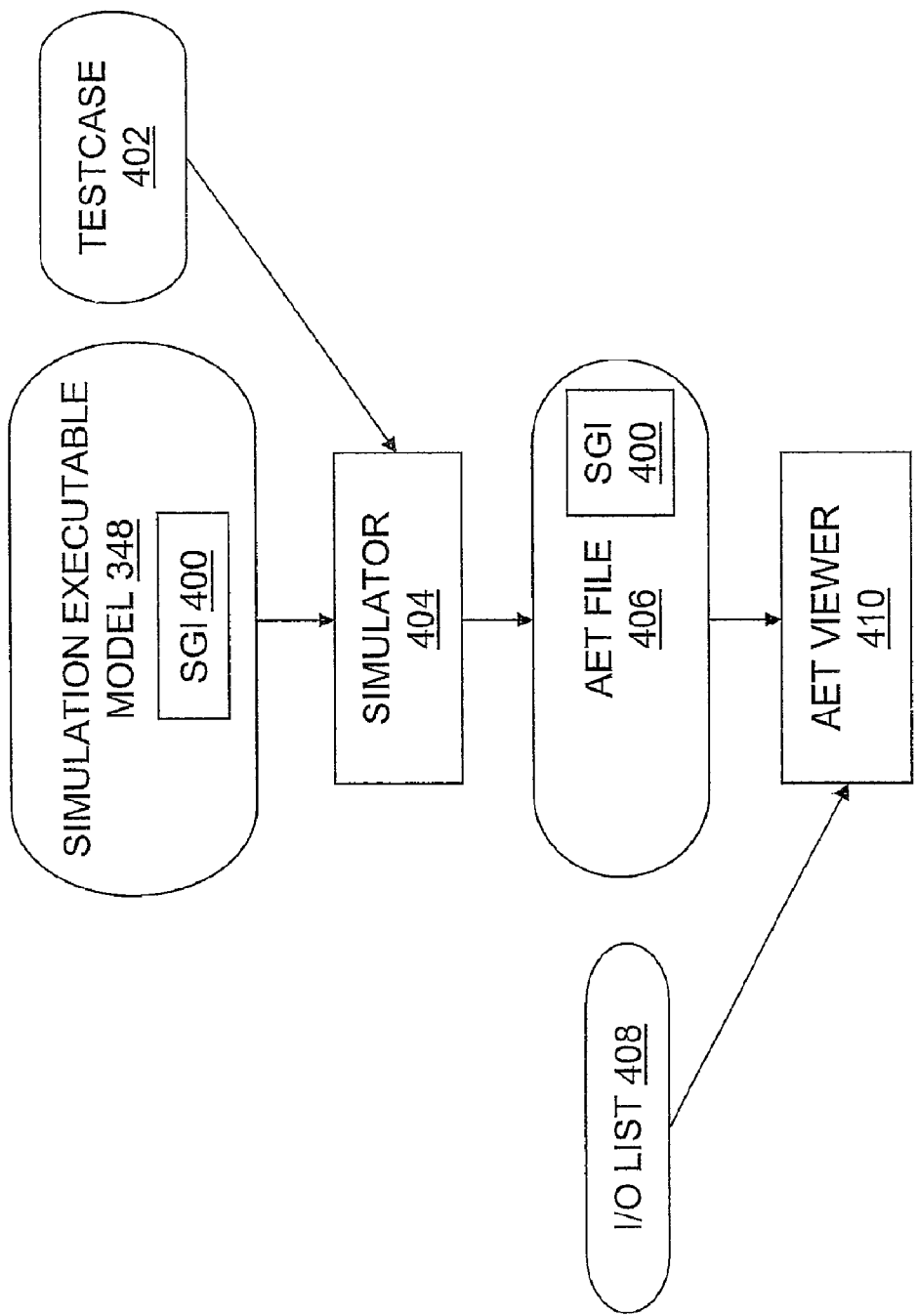
FIG. 4 is a flow diagram depicting simulation of a simulation executable model and presenting the results of simulation to a user.

Referring now to FIG. 4, there is depicted a flow diagram of a process for simulating a design and viewing simulation results in accordance with the present invention. As shown, once a simulation executable model 348 has been obtained by the process of FIG. 3C, a software and/or hardware simulator 404 is utilized to stimulate simulation executable model 348 with a testcase 402 to simulate operation of a digital design. During the simulation, an all events trace (AET) file 406 records data representing the response of simulation executable model 348 to testcase 402. The data within AET file 406 includes values of various signals and/or storage elements within simulation executable model 348 over time as well as SGI 400.

In order to review the contents of AET file 406, a user generally employs a separate or integrated viewer program, referred to herein as AET viewer 410. For example, the user may request AET viewer 410 to present data from AET file 406 either in a graphical format within display screen 22 or in hardcopy format. As described hereinabove, the user can advantageously restrict the presentation of data by AET viewer 410 to particular signals of interest by specifying in a data set (referred to herein as an I/O list 408) the signals of interest.

As illustrated in FIG. 5A, a conventional I/O list 500 in accordance with the prior art is a list containing a large number of entries each setting forth a signal instantiation identifier of one of the signals of interest, which in this case comprise all of the signals within FXU instantiation 321a of FIG. 3B. Thus, as will be appreciated from the simplified example given in FIG. 5A, in the prior art the user must enter each of a potentially large number of signal instantiation identifiers utilizing keyboard 16. This conventional technique of manually keying in signal instantiation identifiers is tedious and error prone.

Additionally, some simulators 404 do not preserve the signal names of signals in descendant design entities that cross design entity boundaries into higher level design entities. Instead, to eliminate signal duplication in the AET file, such simulators 404 only identify a signal in the AET file by its signal name in the highest level design entity in which it appears. Consequently, if a simulator 404 that does not preserve signal names is employed, the user must specify a signal within the I/O list 500 utilizing a signal instantiation identifier that employs the signal name of the signal from the highest level design entity in which the signal appears. For example, as can be seen by comparing entry 502 of FIG. 5A with corresponding entry 504 of I/O list 500' of FIG. 5B, the user of a simulator 404 that does not preserve signal names must utilize the signal instantiation identifier F0 as depicted at reference numeral 504 rather than the signal instantiation identifier FXU.E as illustrated at reference numeral 502. As will be appreciated, a user of AET viewer 410 whose work predominantly pertains to a descendant design entity may have difficulty in determining or easily recalling signal names utilized in a higher level design entity that instantiates the lower level design entity with which the user is familiar.

In place of a conventional I/O list 500 or 500', the present invention permits a user of AET viewer 410 to instead filter presentation of data from AET file 406 utilizing one or more improved I/O lists 408 in accordance with FIG. 5C. As depicted in FIG. 5C, I/O list 408 is list containing one or more entries. In addition to zero or more entries containing conventional signal instantiation identifiers as depicted in FIG. 5A or 5B, an entry of I/O list 408, such as entry 510, may identify a group of one or more signals of interest by a signal group instantiation identifier corresponding to information within SGI 400.

As shown, the signal group instantiation identifier is formed similarly to a signal instantiation identifier and consists of a string of the enclosing entity instantiation names proceeding from the top-level entity instantiation name and terminating with the signal group name enclosed by a pair of angular brackets ("<" and ">") indicating that the bracketed contents are a member of a separate signal group namespace. Thus, the six signals of interest within FXU entity instantiation 321a can simply be identified by the single entry "FXU0.<FXU_Group>", rather than by individually entering the signal instantiation identifiers within I/O list 408. As indicated above, the individual signals comprising the signal group FXU_Group are specified utilizing signal group directives 350 within design entity HDL files 340.

With reference now to FIG. 6A, there is illustrated an exemplary embodiment of a design entity HDL file 340a in accordance with the present invention. As will be appreciated by those skilled in the art, design entity HDL file 340a includes conventional HDL source code describing a design entity, which in this case is design entity FXU 321. The conventional HDL source code includes a port map 600 and signal assignment statements 602. In addition, design entity HDL file 340a includes unconventional HDL comments containing signal group directives 350 (FIG. 3C) in accordance with the present invention.

In design entity HDL file 340a, the signal group directives 350 include two different types of signal group directives: a signal group declaration 610 and a signal preservation directive 620. Signal group declaration 610 begins with an HDL comment of the form "--!! Signal Group signal_group_name;" and ends with an HDL comment of the form "--!! END Signal Group signal_group_name;", where signal_group_name is a signal group name (in this example, FXU_Group) that is unique for the given target design entity. Between the beginning and ending statements of signal group declaration 610, the signal names of one or more signals of interest are listed in the desired order of presentation by AET viewer 410. In this embodiment, signal names are specified relative to the target design entity (e.g., FXU design entity 321). At least some embodiments of the present invention permit signal names higher in the design entity hierarchy to be specified relative to the target design entity utilizing the conventional syntax "..\" to indicate a next higher level of hierarchy.

The user is preferably permitted to further specify additional attributes related to the presentation of signals within signal group declaration 610. For example, the user can specify a desired color for a signal, a default to a waveform or binary signal representation, a desired justification of unaligned bit vectors, etc. Thus, in statement 612 of signal group declaration 610 the user has specified a left justification of the 5-bit signal vector B.C.P(0 . . . 4).

As further depicted in design entity HDL file 340b of FIG. 6B, a signal group declaration, such as signal group declaration 630, also preferably permits the user to specify nested signal groups to any legal depth. To specify a nested signal group comprising a portion of a larger signal group, the user simply includes a statement in a signal group declaration referring to the instantiation identifier of the nested signal group with the signal group enclosed in angular brackets (i.e., "<" and ">"). The use of angular brackets permits HDL compiler 342 to discriminate between the namespaces of signals and signal group names.

Referring back to FIG. 6A, a signal preservation directive 620 is utilized to instruct a simulator 404 that by default does not preserve the lower-level signal name of a renamed signal to do so for a particular renamed signal (e.g., signal G). Thus, assuming simulator 404 does not preserve the lower-level names of renamed signals by default, AET file 406 will contain data for signal instantiation identifiers TOP.FXU0.G and TOP.FXU1.G. As discussed above with reference to FIG. 5B, the capability to preserve a familiar signal name eliminates the need for the user to enter into an I/O list the possibly unfamiliar signal instantiation identifiers TOP.FXU1.H0 and TOP.FXU1.H1 to view the signal data of preserved signal G.

Figure 7A:
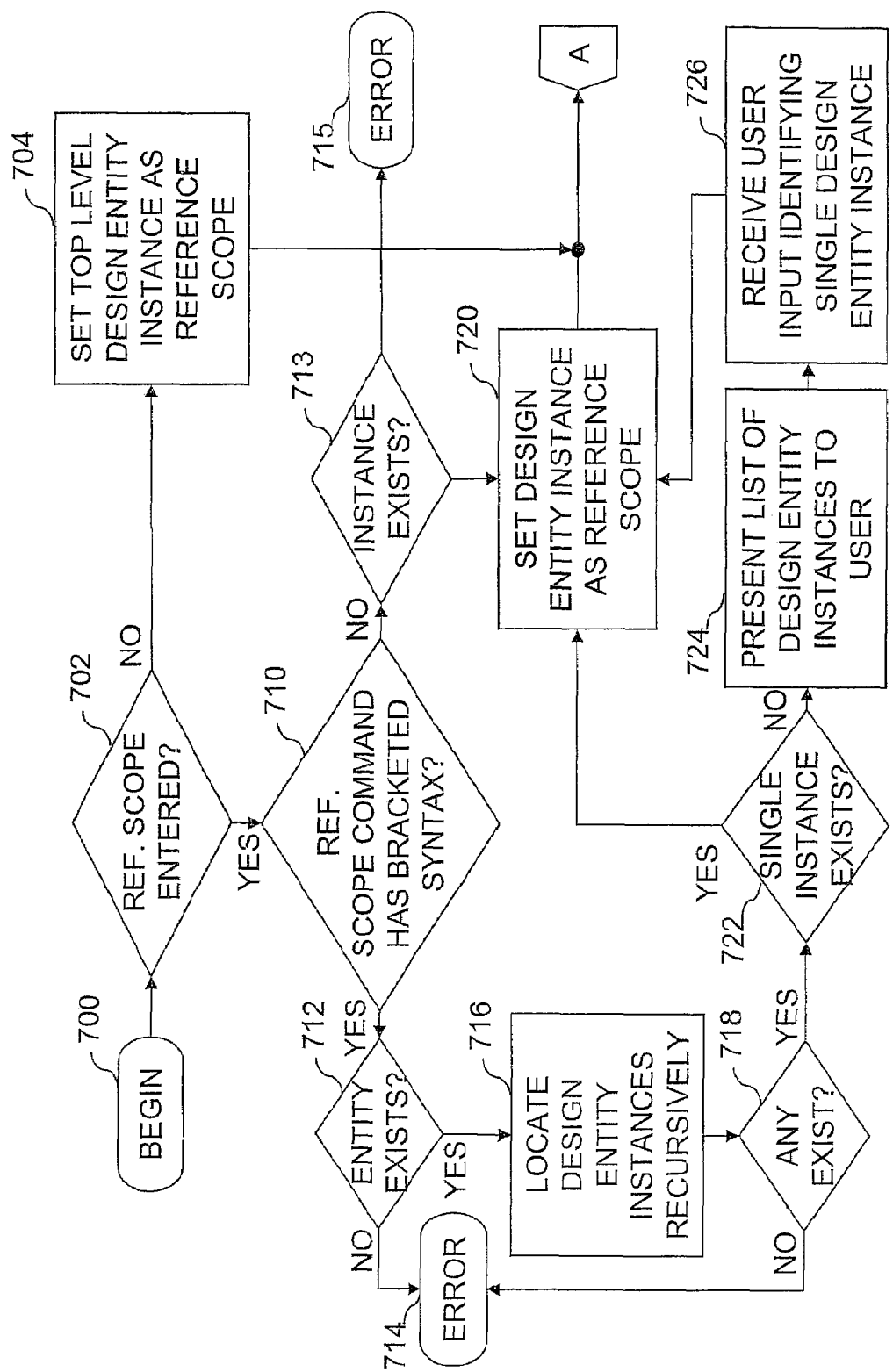
FIGS. 7A-7C together form a high-level logical flowchart of an exemplary process by which an AET viewer processes an I/O list to generate a presentation of an AET file in accordance with the present invention.
Figure 7B:
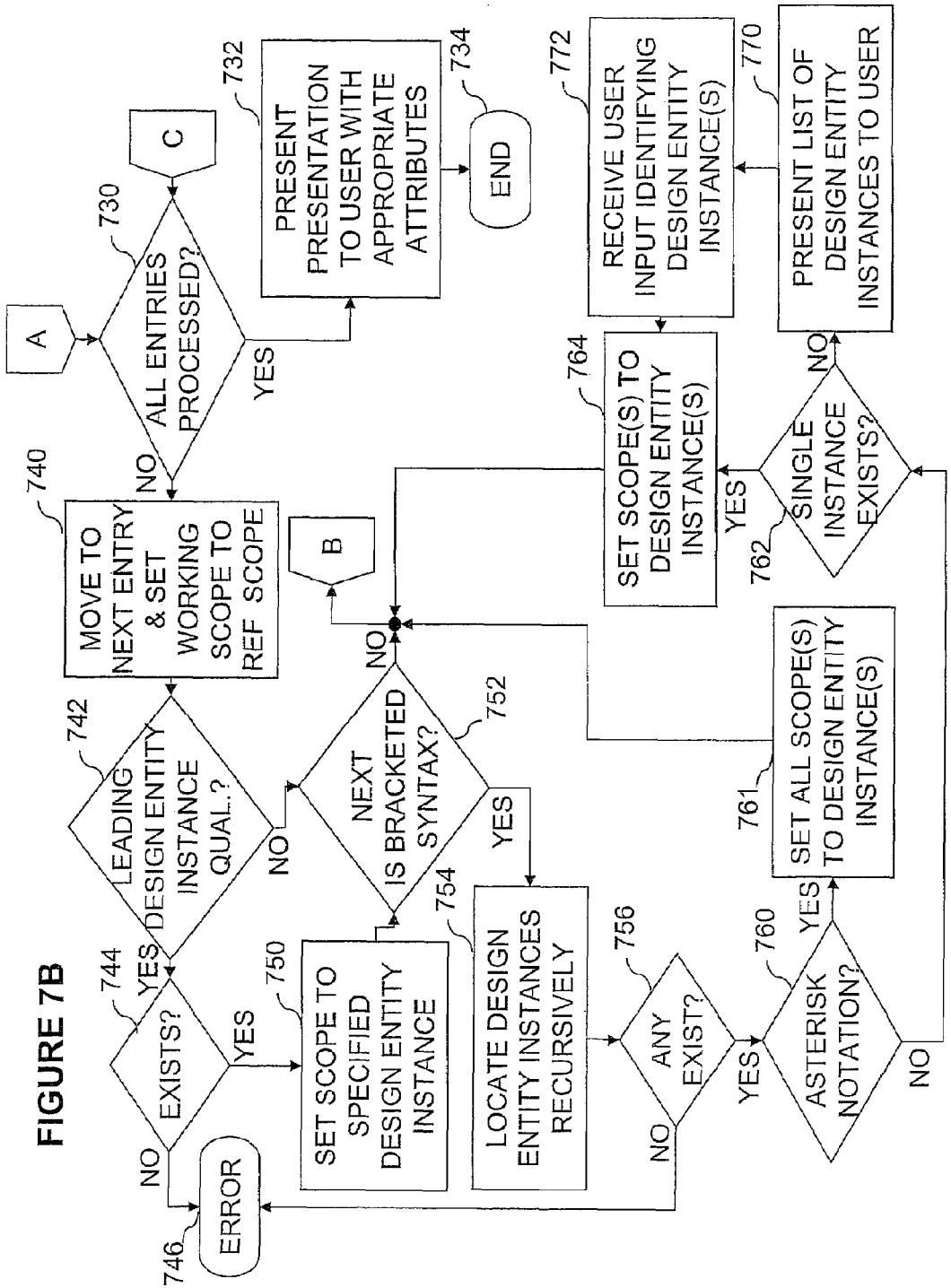
Figure 7C:
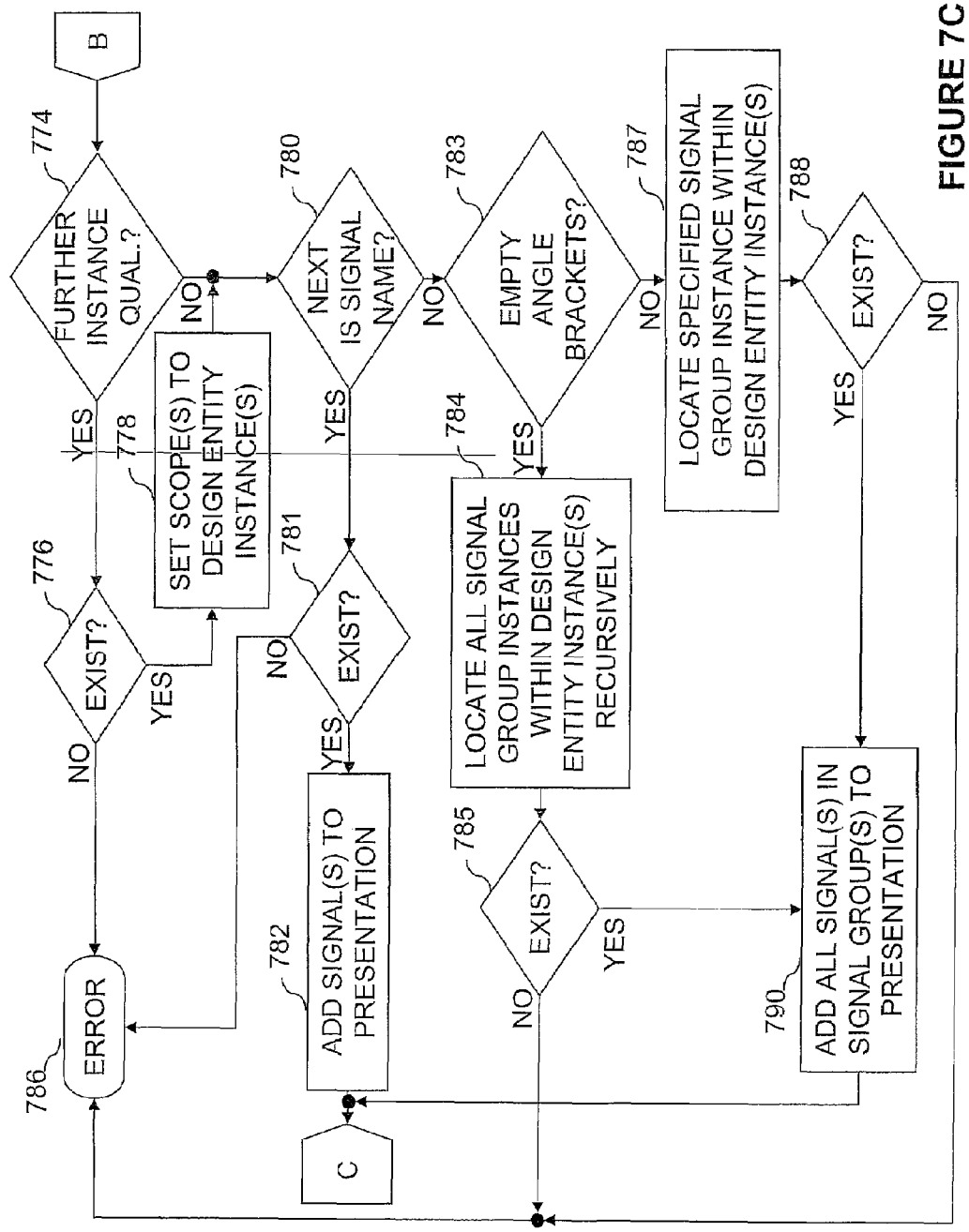

With reference now to FIGS. 7A-7C, there is depicted a high level logical flowchart of an exemplary process by which AET viewer 410 processes an I/O list 408 in accordance with the present invention. As a logical flowchart, operations are depicted logically rather than sequentially, and many of the illustrated operations can be performed in parallel or in an alternative order.

As illustrated, the process begins at block 700 of FIG. 7A and then proceeds to block 702, which illustrates a determination of whether or not a user has entered a reference scope for the I/O list 408, that is, a scope of simulation executable model 348 by reference to which all other I/O list entries will be parsed. By default, the reference scope is the top level design entity instance in the simulation executable model 348, for example, top-level design entity instance 320 of FIG. 3B. In one embodiment, the user is permitted to enter a command further limiting the reference scope of the form "Scope limit:instance_string0.[design_entity].instance_string1", where instance_string0 and instance_string1 are optional design entity instance strings (that for instance_string0 begins with the top-level design entity instance) and design_entity enclosed in square brackets is an optional design entity name. A legal reference scope command includes at least one of the three optional fields instance_string0, [design_entity], and instance_string1. The reference scope command can be communicated to AET viewer 410, for example, via a command line or within I/O list 408. If inserted within an I/O list 408, the reference scope command preferably applies to all entries in that I/O list 408.

As indicated at block 702, if the user has not entered a different reference scope, AET viewer 410 sets the reference scope by default to the top level design entity instance of the simulation executable model 348, as illustrated at block 704. Thereafter, the process passes through page connector A to FIG. 7B. If AET viewer 410 determines at block 702 that the user has entered a different reference scope, AET viewer 410 further parses the reference scope command to determine at block 710 whether or not the reference scope command contains bracketed syntax (e.g., [design_entity]). If not, the process proceeds to block 713, which illustrates AET viewer 410 determining whether of not the design entity instance specified by the reference scope command exists in the simulation executable model 348. If not, processing terminates with an error at block 715. If so, the process passes from block 713 to block 720, which depicts AET viewer 410 setting the reference scope to the particular design entity instance specified within the instance_string0 field of the reference scope command. For example, assuming simulation executable model 329 of FIG. 3B, the reference scope command "Scope limit: TOP.FXU0" sets the reference scope to instance 321a of FXU design entity 321. With this reference scope, entry 510 of I/O list 408 of FIG. 5C can be simplified as <FXU_Group>. Thereafter, the process passes through page connector A to FIG. 7B.

Returning to block 710, in response to a determination that the reference scope command employs bracketed syntax, AET viewer 410 next determines at block 712 whether or not the named design entity exists within simulation executable model 348. If not, processing ends with an error at block 714. If, however, the specified design entity is present in simulation executable model 348, AET viewer 410 recursively searches simulation executable model 348 to identify all the instances of the design entity that are present within the portion of simulation executable model 348 defined by instance_string0, if present. As indicated at block 718, if no instances of the specified design entity exist within the specified scope, processing terminates with an error at block 714. If AET viewer 410 determines at block 718 that at least one instance of the specified design entity was located within the specified scope, AET viewer 410 further determines at block 722 if only a single instance of the design entity was found within the specified scope. If so, the process passes to block 720, which illustrates AET viewer 410 setting that single instance of the design entity as the reference scope. Thereafter, the process passes through page connector A to FIG. 7B.

If AET viewer 410 determines at block 722 that more than one instance of the specified design entity was found within the specified scope, AET viewer 410 presents a list of the design entity instances to the user for selection, for example, via a graphical menu displayed within display screen 22 (block 724). AET viewer 410 then receives user input designating a single one of the multiple design entity instances as defining the desired reference scope, as illustrated at block 726. For example, assuming simulation executable model 329 of FIGS. 3B and I/O list 408' of FIG. 5D, the reference scope command "Scope limit:[FXU]" given at reference numeral 512 of FIG. 5D would cause AET viewer 410 to locate FXU instances 321a and 321b within simulation executable model 329 and present instance identifiers of instances 321a and 321b to the user for selection. Advantageously, regardless of which of FXU instance 321a and 321b is of interest and therefore selected by the user, the signal group can be specified as <FXU_Group>, as shown in entry 512 of I/O list 408' of FIG. 5D. Thereafter, the process passes to block 720, which has been described.

Referring now to FIG. 7B, the process begins at page connector A and then proceeds to block 730, which represents a processing loop in which AET viewer 410 processes each entry within one or more I/O lists to 408 to construct a presentation of AET file 406. If AET viewer 410 determines at block 730 that all entries within the I/O list(s) have been processed the process passes to block 732, which is described below. If, however, at least one entry within an I/O list 408 remains to be processed, the process proceeds to block 740, which depicts AET viewer 410 moving to the first or next signal-identifying entry within the I/O list 408 and initializing a working scope for the entry to the reference scope. Signal-identifying entries within I/O lists 408 are processed with respect to (i.e., as impliedly limited by) the reference scope and take the general form:

instance_string2.[design_entity*].
       instance_string3.signals where:

instance_string2 and instance_string3 are optional design entity instance strings;
   design_entity enclosed in square brackets (i.e., "[" and "]") is an optional design entity name;
   * is an optional universal operator indicating all design_entity instances within the specified scope; and
   signals is a required parameter that specifies a signal name, a signal group name enclosed in angular brackets (i.e., "<" and ">"), or empty angular brackets signifying all signal groups within the specified scope.

The process shown in FIG. 7B proceeds from block 740 to block 742, which depicts AET viewer 410 determining whether the current signal-identifying entry has a leading design entity instance qualifier (e.g., instance_string2). If not, the process passes to block 752, which is described below. If so, the process proceeds from block 742 to block 744, which illustrates AET viewer 410 determining whether or not the specified design entity instance exists within the reference scope of simulation executable model 348. If not, processing terminates with an error at block 746. If so, the process proceeds to block 750. Block 750 illustrates AET viewer 410 setting the current scope to the scope formed by appending the scope defined by the design entity instance qualifier to the reference scope. Next, AET viewer 410 determines at block 752 whether or not the next field within the signal-identifying entry of I/O list 408 is a design_entity qualifier enclosed in square brackets. If not, the process passes through page connector B to FIG. 7C. If so, processing of the signal-identifying entry continues at block 754.

Block 754 shows AET viewer 410 recursively searching simulation executable mode 1 348 to locate all design entity instances within the current scope having an entity name matching the specified design entity name. AET viewer 410 then determines at block 756 whether or not any such design entity instances exist. If not, processing ends with an error condition at block 746. If so, AET viewer 410 further determines at block 760 whether or not the bracketed syntax includes an asterisk signifying the inclusion of all design entity instances within the specified scope. If so, AET viewer 410 narrows the working scope(s) of the entry to the one or more design entity instance(s) located at block 754 (block 761). Thereafter, the process passes through page connector B to FIG. 7C.

Returning to block 760, in response to a negative determination, the process proceeds to block 762, which illustrates AET viewer 410 determining whether a single design entity instance was discovered at block 754. If so, the working scope is set at block 764 to the single design entity instance. Thereafter, the process passes through page connector B to FIG. 7C. If, on the other hand, AET viewer 410 determines at block 762 that more than one design entity instances was discovered at block 754, AET viewer 410 presents a list of the design entity instances to the user for selection, for example, via a graphical menu displayed within display screen 22 (block 770). AET viewer 410 then receives user input designating one or more of the multiple design entity instances as defining the desired working scope, as illustrated at block 772. Thereafter, the process passes to block 764, which depicts AET viewer 410 establishing one or more working scopes in accordance with the user's selection. Thereafter, the process passes through page connector B to FIG. 7C.

With reference now to FIG. 7C, the process begins at page connector B and then proceeds to block 774, which depicts AET viewer 410 further parsing the signal-identifying entry to determine whether the entry contains a further instance qualifier (e.g., instance_string3) to limit the working scope(s). If not, the process passes to block 780, which is described below. If so, AET viewer 410 determines at block 776 whether or not the specified design entity instance(s) exist. If not, the process ends with an error at block 786. If the specified design entity instance(s) exist, AET viewer 410 narrows the working scope(s) of the current signal-identifying entry to the design entity instance(s) indicated by the second instance qualifier (block 778). Thereafter, the process passes to block 780.

Block 780 depicts AET viewer 410 further parsing the signal-identifying entry of I/O list 408 to determine if the terminal signals field of the entry contains a single signal name or a signal group name. If the signals field contains a signal name, AET viewer 410 next determines at block 781 if the specified signal exists within the working scope(s). If not, processing terminates at block 786 with an error condition. If AET viewer 410 determines at block 781 if the specified signal exists within the working scope(s). If not, processing terminates at block 786 with an error condition. If so, AET viewer 410 adds the specified signal(s) to the presentation of AET file 406 (block 782). Thereafter, the process returns to block 730 of FIG. 7B via page connector C.

Referring again to block 780, in response to determining that the signals field of the signal-identifying entry does not contain a signal name, the process passes to block 783, which depicts AET viewer 410 determining whether the signals field contains empty angle brackets. If so, AET viewer 410 recursively locates all signal group instances within the design entity instances within the working scope(s), as shown at block 784. If AET viewer determines that none exists at block 785, processing ends with an error at block 786. If, on the other hand, AET viewer 410 determines at block 785 that one or more signal groups are present, AET viewer 410 determines the individual signals comprising the signal groups from SGI 400 and adds all such signals to the presentation at block 790. Thereafter, the process returns through page connector C to FIG. 7B.

Returning to block 783, if AET viewer 410 determines that the signals field of the signal-identifying entry of I/O list 408 does not contain empty angle brackets, but instead specifies a signal group name within angle brackets, the process passes to block 787. Block 787 illustrates AET viewer 410 recursively locating instances of the specified signal group instances within the design entity instances within the working scope(s). As represented by block 788, if no signal group instances are located, processing ends with an error condition at block 786. Alternatively, if at least one instance of the named signal group is located, processing proceeds to block 790 and following blocks which have been described.

As has been described, the present invention provides a method, system and program product for processing simulation results for presentation. In accordance with the present invention, the amount of user input required to filter the presentation of simulation results is substantially reduced through the use of predetermined signal groups and, optionally, the use of scope commands. In addition, the ease of understanding simulation results is enhanced through support of signal preservation directives that enable a designer to designate signals for which signal names are to be preserved in the presence of signal renaming.

While the invention has been particularly shown as described with reference to a preferred embodiment, it will be understood by those skilled in the art that various changes in form and detail may be made therein without departing from the spirit and scope of the invention. For example, one of the embodiments of the invention can be implemented with program code resident in random access memory 28 or non-volatile storage of one or more computer systems configured generally as described in FIG. 1 and FIG. 2. Until required by computer system 10, the set of program code may be stored in another computer readable storage device, such as disk drive 33 or CD-ROM, or in data storage of another computer and transmitted over a local area network or a wide area network, such as the Internet, when desired by the user. The program code embodied in a computer usable medium may be referred to as a computer program product.

What is claimed is:

1. A method of data processing in a data processing system, said method comprising:
    a hardware description language (HDL) compiler compiling a HDL source code file describing a design entity and including signal group directives into a simulation executable model that includes an instantiation of the design entity and signal group information based on the signal group directives, wherein said compiling includes the HDL compiler establishing, by reference to the signal group directives, membership of multiple different signal names in a signal group specified in the signal group information, wherein each of the multiple different signal names in the signal group has a unique alphabetic string;
    producing, from the simulation executable model, an event trace file including simulation results and the signal group information;
    receiving a data set including at least one entry specifying the signal group by a signal group name from the signal group directives;
    in response to said receiving the data set:
        processing the at least one entry in the data set to identify the signal group name;
        accessing the signal group information included in the event trace file to determine the multiple different signal names of multiple different signals that are members of the signal group;
        receiving a scope command indicating a reference scope in terms of the design entity instance in the simulation executable model;
        in response to said receiving the scope command, interpreting the at least one entry in the data set in relation to the reference scope; and
        presenting one or more simulation results from the event trace file associated with instances of the multiple different signals.

2. The method of claim 1, further comprising:
    compiling one or more proto files into the simulation executable model.

3. The method of claim 1,
    wherein the design entity is a member of a design entity hierarchy; and
    wherein said establishing includes searching the design entity hierarchy for the design entity.

4. The method of claim 1,
    wherein the design entity is a member of a design entity hierarchy; and
    wherein said establishing includes recursively searching the design entity hierarchy for the design entity.

5. The method of claim 1,
    wherein HDL comments of the HDL source code file include the signal group directives.

6. The method of claim 1, wherein said presenting the one or more simulation results includes presenting the one or more simulation results in a graphical format.

7. The method of claim 6, wherein said presenting the one or more simulation results in the graphical format includes presenting at least one of the multiple signals as a waveform signal representation.

8. The method of claim 6, wherein said presenting the one or more simulation results in the graphical format includes presenting at least one of the multiple signals as a binary signal representation.

9. The method of claim 1, wherein:
    at least one of the multiple different signal names identifies a name and length of a multi-bit signal vector; and
    at least one of the multiple different signal names identifies a single-bit signal.

10. A program product, comprising:
    a computer readable memory medium; and
    program code within the computer readable memory medium that when executed by a data processing system causes the data processing system to perform:
        compiling a hardware description language (HDL) source code file describing a design entity and including signal group directives into a simulation executable model that includes an instantiation of the design entity and signal group information based on the signal group directives, wherein said compiling includes establishing, by reference to the signal group directives, membership of multiple different signal names in a signal group specified in the signal group information, wherein each of the multiple different signal names in the signal group has a unique alphabetic string;
        producing, from the simulation executable model, an event trace file including simulation results and the signal group information;
        receiving a data set including at least one entry specifying the signal group by a signal group name from the signal group directives;
        in response to said receiving the data set:
            processing the at least one entry in the data set to identify the signal group name;
            accessing the signal group information included in the event trace file to determine the multiple different signal names of multiple different signals that are members of the signal group;
            receiving a scope command indicating a reference scope in terms of the design entity instance in the simulation executable model;
            in response to said receiving the scope command, interpreting the at least one entry in the data set in relation to the reference scope; and
            presenting one or more simulation results from the event trace file associated with instances of the multiple different signals.

11. The program product of claim 10, wherein the program code within the computer readable memory medium that when executed by a data processing system causes the data processing system to further perform:
    compiling one or more proto files into the simulation executable model.

12. The program product of claim 10,
wherein the design entity is a member of a design entity hierarchy; and
wherein said establishing includes searching the design entity hierarchy for the design entity.

13. The program product of claim 10,
wherein the design entity is a member of a design entity hierarchy; and
wherein said establishing includes recursively searching the design entity hierarchy for the design entity.

14. The program product of claim 10,
wherein HDL comments of the HDL source code file include the signal group directives.

15. The program product of claim 10, wherein said presenting the one or more simulation results includes presenting the one or more simulation results in a graphical format.

16. The program product of claim 15, wherein said presenting the one or more simulation results in the graphical format includes presenting at least one of the multiple signals as a waveform signal representation.

17. The program product of claim 15, wherein said presenting the one or more simulation results in the graphical format includes presenting at least one of the multiple signals as a binary signal representation.

18. The program product of claim 10, wherein:
at least one of the multiple different signal names identifies a name and length of a multi-bit signal vector; and
at least one of the multiple different signal names identifies a single-bit signal.

19. A data processing system, comprising:
a processor; and
data storage coupled to the processor, the data storage including program code that when executed by the processor causes the data processing system to perform:
compiling a hardware description language (HDL) source code file describing a design entity and including signal group directives into a simulation executable model that includes an instantiation of the design entity and signal group information based on the signal group directives, wherein said compiling includes establishing, by reference to the signal group directives, membership of multiple different signal names in a signal group specified in the signal group information, wherein each of the multiple different signal names in the signal group has a unique alphabetic string;
producing, from the simulation executable model, an event trace file including simulation results and the signal group information;
receiving a data set including at least one entry specifying the signal group by a signal group name from the signal group directives;
in response to said receiving the data set:
processing the at least one entry in the data set to identify the signal group name;
accessing the signal group information included in the event trace file to determine the multiple different signal names of multiple different signals that are members of the signal group;
receiving a scope command indicating a reference scope in terms of the design entity instance in the simulation executable model;
in response to said receiving the scope command, interpreting the at least one entry in the data set in relation to the reference scope; and
presenting one or more simulation results from the event trace file associated with instances of the multiple different signals.

20. The data processing system of claim 19, wherein the data storage including program code that when executed by the processor causes the data processing system to further perform:
compiling one or more proto files into the simulation executable model.

21. The data processing system of claim 19,
wherein the design entity is a member of a design entity hierarchy; and
wherein said establishing includes searching the design entity hierarchy for the design entity.

22. The data processing system of claim 19,
wherein said presenting the one or more simulation results includes presenting the one or more simulation results in a graphical format;
wherein said presenting the one or more simulation results in the graphical format includes presenting at least one of the multiple signals as a waveform signal representation; and
wherein said presenting the one or more simulation results in the graphical format includes presenting at least one of the multiple signals as a binary signal representation.

23. The data processing system of claim 19, wherein:
at least one of the multiple different signal names identifies a name and length of a multi-bit signal vector; and
at least one of the multiple different signal names identifies a single-bit signal.

* * * * *